United States Patent
Wu et al.

(10) Patent No.: US 9,437,619 B2
(45) Date of Patent: Sep. 6, 2016

(54) ARRAY SUBSTRATE, MANUFACTURING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Song Wu, Beijing (CN); Jieqiong Bao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 202 days.

(21) Appl. No.: 14/362,038

(22) PCT Filed: Apr. 28, 2013

(86) PCT No.: PCT/CN2013/074970
§ 371 (c)(1),
(2) Date: May 30, 2014

(87) PCT Pub. No.: WO2014/127587
PCT Pub. Date: Aug. 28, 2014

(65) Prior Publication Data
US 2016/0111442 A1    Apr. 21, 2016

(30) Foreign Application Priority Data

Feb. 25, 2013   (CN) .......................... 2013 1 0058642

(51) Int. Cl.
*H01L 27/12*   (2006.01)

(52) U.S. Cl.
CPC ......... *H01L 27/124* (2013.01); *H01L 27/1262* (2013.01); *H01L 27/1288* (2013.01)

(58) Field of Classification Search
CPC .................. H01L 21/76838; H01L 21/76843; H01L 27/1214; H01L 27/124; H01L 27/1262; H01L 27/1288; H01L 29/4908
See application file for complete search history.

(56) References Cited

U.S. PATENT DOCUMENTS

2002/0070382 A1 *   6/2002   Yamazaki ........... G02F 1/13454
257/72
2003/0127649 A1 *   7/2003   Chae .................... G02F 1/13458
257/72

(Continued)

FOREIGN PATENT DOCUMENTS

CN        1682259 A    12/1971
CN      101494201 A     7/2009

(Continued)

OTHER PUBLICATIONS

First Chinese Office Action dated Feb. 28, 2015: Appln. No. 201310058642.2.

(Continued)

*Primary Examiner* — Raj R Gupta
(74) *Attorney, Agent, or Firm* — Ladas & Parry LLP

(57) ABSTRACT

An array substrate and a manufacturing method thereof and a display device are provided, wherein the array substrate includes: a substrate, and a gate electrode, a gate insulating layer, an active layer, a source electrode, a drain electrode and an insulating protection layer sequentially formed on the substrate, and the substrate is further provided with a pixel electrode and a common electrode, and a first leading wire hole connecting the pixel electrode with the drain electrode and a second leading wire hole connecting the common electrode with a common electrode line, the pixel electrode is provided on the substrate, and the gate electrode is directly provided on a transparent conductive layer which is provided at the same layer with the pixel electrode; the pixel electrode is connected with the drain electrode through a first metal connection layer provided in the first leading wire hole, and the first metal connection layer is provided at the same layer with the gate electrode.

17 Claims, 10 Drawing Sheets

(56) References Cited

U.S. PATENT DOCUMENTS

| | | | |
|---|---|---|---|
| 2004/0058527 A1* | 3/2004 | Yamazaki | G02F 1/136286 438/643 |
| 2006/0138426 A1 | 6/2006 | Yoo et al. | |
| 2007/0096209 A1 | 5/2007 | Toyota et al. | |
| 2013/0140574 A1 | 6/2013 | Liu et al. | |

FOREIGN PATENT DOCUMENTS

| | | |
|---|---|---|
| CN | 102709234 A | 10/2012 |
| CN | 203085536 U | 7/2013 |

OTHER PUBLICATIONS

International Preliminary Report on Patentability Appln. No. PCT/CN2013/074970; Dated Aug. 25, 2015.

International Search Report mailed Dec. 5, 2013; PCT/CN2013/074970.

Written Opinion of the International Searching Authority mailed Dec. 5, 2013; PCT/CN2013/074970.

* cited by examiner

ARRAY SUBSTRATE, MANUFACTURING METHOD THEREOF AND DISPLAY DEVICE

TECHNICAL FIELD

Embodiments of the present invention relate to an array substrate, a manufacturing method thereof and a display device.

BACKGROUND

In the ADvanced Super Dimension Switch (AD-SDS, abbreviated as ADS) technology, a parallel electric field generated by fringes of a pixel electrode or a common electrode in the same plane and an electric field generated between the pixel electrode and the common electrode can constitute a multi-dimension electric field, so as to make liquid crystal molecules oriented in all directions between the pixel electrodes or the common electrodes and directly above the electrodes inside a liquid crystal cell capable of rotating, thus improving the operating efficiency of liquid crystals and increasing the light transmittance. The ADS technology can improve the displaying quality of a TFT-LCD, and has advantages of high resolution, high transmittance, low power consumption, wide viewing angle, high aperture ratio, low chromatic aberration, no push Mura, etc. . . .

An ADS display is formed by cell-assembling an ADS array substrate and a color filter substrate, and liquid crystal is injected between the ADS array substrate and the color filter substrate. Generally speaking, as shown in FIG. 1, the ADS array substrate comprises: a substrate 1, and a common electrode layer 8, a gate metal layer 10, a gate insulating layer 12, an active layer 9, a source/drain metal layer 11, an insulating protection layer 7 and a pixel electrode layer 2 sequentially formed on the substrate 1, wherein the gate metal layer comprises the gate electrode and gate lines (not shown in the drawing) of a TFT, the active layer 9 comprises a semiconductor layer 3 and a doping semiconductor layer 4, the source/drain metal layer 11 comprises a source electrode 5, a drain electrode 6 and data lines of the TFT, the pixel electrode layer 2 comprises a pixel electrode, the common electrode layer 8 comprises a common electrode, and the drain electrode 6 of the source/drain metal layer 11 is connected with the pixel electrode layer 2 through a through hole.

Currently, a manufacturing method of the ADS array substrate usually comprises five or even six patterning processes, taking five patterning processes as an example, an implementation process usually comprises: forming the common electrode layer 8 with a first patterning process; forming the gate metal layer 10 with a second patterning process; forming the active layer 9 (the semiconductor layer 3 and the doping semiconductor layer 4) and the source/drain metal layer 11 with a third patterning process; forming the insulating protection layer 7 with a fourth patterning process, and forming the through hole in the insulating protection layer 7 which connects the drain electrode 6 of the source/drain metal layer and the pixel electrode layer 2; forming the pixel electrode layer 2 with a fifth patterning process, thus, the production of the array substrate is completed.

However, as the number of the patterning processes directly affects production cost and yield, and the larger the number of the patterning processes is, the longer the production period is, the higher the production cost is, and the lower the yield is. Therefore, how to effectively reduce the number of the patterning processes is a technical problem that needs to be solved during producing the array substrate.

SUMMARY

Embodiments of the present invention provide an array substrate and a manufacturing method thereof and a display device, which can reduce the number of the patterning processes during producing the array substrate, and then can effectively lower the production cost and improve the yield.

To achieve the above objects, the embodiments of the present invention use the following technical solutions.

On the one hand, the embodiments of the present invention provide an array substrate, comprising: a substrate; a gate electrode, a gate insulating layer, an active layer, a source electrode, a drain electrode and an insulating protection layer, sequentially formed on the substrate, wherein the substrate is further provided with a pixel electrode and a common electrode, and a first leading wire hole connecting the pixel electrode with the drain electrode and a second leading wire hole connecting the common electrode with a common electrode line, the pixel electrode is provided on the substrate, and the gate electrode is directly provided on a transparent conductive layer which is provided in the same layer with the pixel electrode, the pixel electrode is connected with the drain electrode through a first metal connection layer provided in the first leading wire hole, and the first metal connection layer is provided in the same layer with the gate electrode.

Optionally, the common electrode line and the gate electrode are provided in the same layer, and the common electrode and the common electrode line are connected through a second metal connection layer provided in the second leading wire hole, and the second metal connection layer and the source electrode and the drain electrode are provided in the same layer.

Optionally, the array substrate further comprises: a source/drain leading wire terminal and a gate leading wire terminal provided at an edge of the array substrate, wherein the source/drain leading wire terminal is connected with a data line through a metal connection layer provided in a source/drain leading wire hole, and the data line and the source electrode and the drain electrode are provided in the same layer; and the gate leading wire terminal is connected with a gate line through the second metal connection layer provided in a gate leading wire hole, and the gate line and the gate electrode are provided in the same layer.

The embodiments of the present invention further provide another array substrate, comprising: a substrate and a gate electrode, a gate insulating layer, an active layer, a source electrode, a drain electrode and an insulating protection layer sequentially formed on the substrate, and the substrate being further provided with a pixel electrode and a common electrode, wherein the common electrode is provided on the substrate, and the gate electrode is directly provided on a transparent conductive layer which is provided in the same layer with the common electrode; and the pixel electrode is provided on the insulating protection layer which is provided with an insulating protection layer through hole, and the pixel electrode is connected with the drain electrode through the insulating protection layer through hole Optionally, the common electrode line and the gate electrode are provided in the same layer, and the common electrode line is directly connected with the common electrode below the common electrode line.

The embodiments of the present invention further provide a display device comprising the above array substrate.

On the other hand, the embodiments of the present invention further provide a manufacturing method of an array substrate, comprising: forming a pixel electrode, a gate electrode, a first metal connection layer, a gate insulating layer, an active layer and a first leading wire hole through a first patterning process; forming a source electrode, a drain electrode, a second metal connection layer and an insulating protection layer through a second patterning process, and the drain electrode being connected with the pixel electrode through the first metal connection layer provided in the first leading wire hole; and forming through a third patterning process a common electrode which is connected with a common electrode line through the second metal connection layer provided in a second leading wire hole.

Alternatively, the first patterning process comprises a multi-tone mask process and a lift-off technology.

Optionally, the first patterning process further forms the second leading wire hole and the common electrode line, and comprises the following steps: forming a first transparent conductive film and a gate metal film; coating a photoresist on the substrate with the first transparent conductive film and the gate metal film formed thereon; performing a multi-tone exposure to the substrate with a multi-tone mask, and after exposing and developing, forming a first photoresist pattern on the substrate formed with the first transparent conductive film and the gate metal film so that in the first photoresist pattern, a photoresist with a first thickness is formed at a preset position where the pixel electrode is formed subsequently, a photoresist with a second thickness is formed at a preset position where the gate electrode is formed subsequently, and a photoresist with a third thickness is formed at preset positions where the first leading wire hole, the common electrode line and the second leading wire hole are formed subsequently, and the third thickness is larger than the second thickness, and the second thickness is larger than the first thickness; etching the substrate to remove the exposed first transparent conductive film and gate metal film; performing an ashing treatment to the substrate to remove the photoresist with the first thickness; etching the substrate to remove the exposed gate metal film and thus form the pixel electrode; performing an ashing treatment to the substrate to remove the remaining photoresist in a region corresponding to the second thickness; forming a gate insulating layer and a semiconductor layer; and removing the remaining photoresist in a region corresponding to the third thickness and the gate insulating layer and the semiconductor layer above it to form the active layer, the first leading wire hole and the second leading wire hole using a lift-off process.

Optionally, the second patterning process comprises following steps: forming a source/drain metal layer; coating a photoresist on the substrate formed with the source/drain metal layer; performing a multi-tone exposure to the substrate with a multi-tone mask, and after exposing and developing, forming a photoresist with a fourth thickness at a preset position where a TFT channel is formed subsequently, forming a photoresist with a fifth thickness at a preset position where a source/drain electrode is formed subsequently, and forming a photoresist with a sixth thickness at a preset position where the second leading wire hole is formed subsequently, wherein, the sixth thickness is larger than the fifth thickness, and the fifth thickness is larger than the fourth thickness; etching the substrate to remove the exposed source/drain metal layer and the semiconductor layer; performing an ashing treatment to the substrate to remove the photoresist with the fourth thickness and etching the exposed part to forming the TFT channel; performing an ashing treatment to the substrate to remove the remaining photoresist in a region corresponding to the fifth thickness to form the source/drain electrode; forming an insulating protection layer; and removing the remaining photoresist and the insulating protection layer above it to form the second leading wire hole using an lift-off process.

Optionally, the third patterning process comprises the following steps: forming a second transparent conductive film; coating a photoresist on the substrate formed with the second transparent conductive film; and performing exposing, developing and etching processes to form the common electrode.

In addition, the embodiments of the present invention further provide another manufacturing method of the array substrate, comprising: forming a common electrode, a gate electrode, a common electrode line, a gate insulating layer and an active layer through a first patterning process; forming a source electrode, a drain electrode and an insulating protection layer through a second patterning process, and the insulating protection layer being provided with an insulating protection layer through hole; and forming through a third patterning process a pixel electrode which is connected with the drain electrode through the insulating protection layer through hole.

Optionally, the first patterning process comprises following steps: forming a first transparent conductive film and a gate metal film on a substrate; coating a photoresist on the substrate with the first transparent conductive film and the gate metal film formed thereon; performing a multi-tone exposure to the substrate with a multi-tone mask, and after exposing and developing, forming a photoresist with a sixth thickness at a preset position where the common electrode is formed subsequently, forming a photoresist with a seventh thickness at preset positions where the gate electrode and the common electrode line are formed subsequently, and the seventh thickness being larger than the sixth thickness; etching the substrate to remove the exposed first transparent conductive film and gate metal film; performing an ashing treatment to the substrate to remove the photoresist with the sixth thickness; etching the exposed part to remove the exposed gate metal film and form the common electrode; performing an ashing treatment to the substrate to remove the remaining photoresist in a region corresponding to the seventh thickness and form the gate electrode and the common electrode line; and depositing a gate insulating layer and a semiconductor layer.

Optionally, the second patterning process comprises the following steps: forming a source/drain metal layer; coating a photoresist on the substrate formed with the source/drain metal layer; performing a multi-tone exposure to the substrate with a multi-tone mask, and after exposing and developing, forming a photoresist with a tenth thickness at a preset position where a TFT channel is formed subsequently, forming a photoresist with an eleventh thickness at a preset position where a source/drain electrode is formed subsequently, and forming a photoresist with a twelfth thickness at a preset position where an insulating protection layer through hole is formed subsequently, wherein, the twelfth thickness is larger than the eleventh thickness, and the eleventh thickness is larger than the tenth thickness; etching the substrate to remove the exposed source/drain metal layer and the semiconductor layer; performing an ashing treatment to the substrate to remove the photoresist with the tenth thickness and etching the exposed part to form the TFT channel; performing an ashing treatment to the substrate to remove the remaining photoresist in a area corresponding to the eleventh thickness and faun the source/ drain electrode; forming the insulating protection layer; and removing the remaining photoresist and the insulating protection layer above it to form the insulating protection layer through hole using a lift-off process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the present invention provide an array substrate and a manufacturing method thereof and a display device, which can reduce the number of the patterning processes during producing the array substrate, and thus effectively lower the production cost and improve the yield.

The embodiments of the present invention will be detailed hereinafter in combination with the drawings. The specific embodiments described herein are only used to explain the embodiments of the present invention and are not intended to restrict the embodiments of the present invention.

A First Embodiment

Figure 2A:
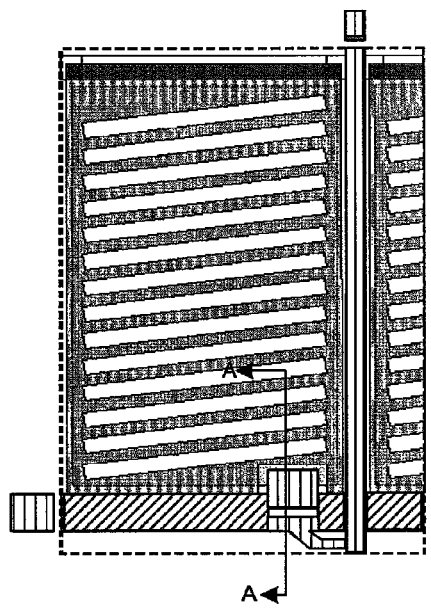
FIGS. 2(a) and 2(b) are respectively a schematic structural plan view and a schematic cross-sectional structural view of along line A-A of an array substrate provided by a first embodiment of the present invention.
Figure 2B:
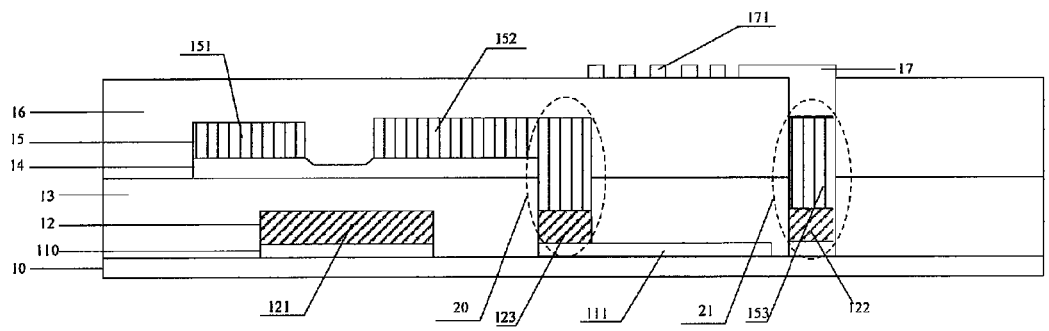

The first embodiment of the present invention provides an array substrate, as shown in FIGS. 2(a)-(b), the array substrate comprises: a substrate 10; and a gate electrode 121, a gate insulating layer 13, an active layer 14, a source electrode 151, a drain electrode 152 and an insulating protection layer 16 sequentially formed on the substrate 10, and the substrate 10 is further provided with a pixel electrode 111 and a common electrode 171, and a first leading wire hole 20 connecting the pixel electrode 111 with the drain electrode 152 and a second leading wire hole 21 connecting the common electrode 171 with a common electrode line 122, wherein, the pixel electrode 111 is provided on the substrate 10, and the gate electrode 121 is directly provided on a transparent conductive layer which is provided at the same layer with the pixel electrode 111; the pixel electrode 111 is connected with the drain electrode 152 through a first metal connection layer 123 provided in the first leading wire hole 20, and the first metal connection layer 123 is provided at the same layer with the gate electrode 121.

Alternatively, in this embodiment the common electrode line 122 and the gate electrode 121 are provided in the same layer, the common electrode 171 and the common electrode line 122 are connected through a second metal connection layer 153 provided in the second leading wire hole 21, and the second metal connection layer 153 and the source electrode 151 and the drain electrode 152 are provided in the same layer.

The substrate 10 in this embodiment is provided from bottom to top with a pixel electrode layer 11 (a layer in which the pixel electrode 111 and the transparent conductive layer 110 are disposed), a gate metal layer 12 (a layer in which the gate electrode 121, gate lines, the first metal connection layer 123 and the common electrode line 122 are disposed), the gate insulating layer 13, the active layer 14, a source/drain metal layer 15 (a layer in which the source electrode 151, the drain electrode 152 and the second metal connection layer 153 are disposed), the insulating protection layer 16 and a common electrode layer 17 (a layer in which the common electrode 171 is disposed).

Herein, the pixel electrode layer 11 is formed with a transparent conductive film, a pattern of the pixel electrode layer 11 comprises the pixel electrode 111 and further comprises the transparent conductive layer 110 maintained below the gate metal layer 12 while having the same pattern with the gate metal layer 12; the gate metal layer 12 is directly provided on the pixel electrode layer 11, and a pattern thereof comprises the gate electrode 121, the gate lines (not shown) and the common electrode line 122, and further comprises the first metal connection layer 123 provided in the first leading wire hole 20. During a manufacturing process, the transparent conductive film (for forming the pixel electrode layer 11) is deposited first, then a gate metal film is directly deposited on the transparent conductive film, through a multi-tone mask process, the pixel electrode 111, the gate electrode 121, the gate lines and the common electrode line 122 can be formed through one patterning process (a first patterning process in the manufacturing process of the array substrate). Herein, the pixel electrode 111 is a single-layer film structure formed with the transparent conductive film, and the gate electrode 121, the gate lines and the common electrode lines 122 are substantially double-layer film structures constituted by a metal film (corresponding to the gate metal layer 12) and the transparent conductive layer 110 (corresponding to the pixel electrode layer 11). In addition, during forming the gate electrode 121 and the gate lines, the first metal connection layer 123 is synchronously formed in the first leading wire hole 20.

The gate insulating layer 13 in this embodiment is provided with through holes in regions corresponding to the first leading wire hole 20 and the second leading wire hole 21. During forming, in the first patterning process a photoresist is retained in the regions corresponding to the first leading wire hole 20 and the second leading wire hole 21, then the gate insulating layer is deposited, and a photoresist stripping process (that is, a lift-off process) is used to form through holes in the regions in the gate insulating layer 13 corresponding to the first leading wire hole 20 and the second leading wire hole 21. Through the through hole of the gate insulating layer 13, the drain electrode 152 formed subsequently directly contacts the first metal connection layer 123, thus an electric connection between the drain electrode 152 of the TFT and the pixel electrode 111 is achieved.

Figure 1:
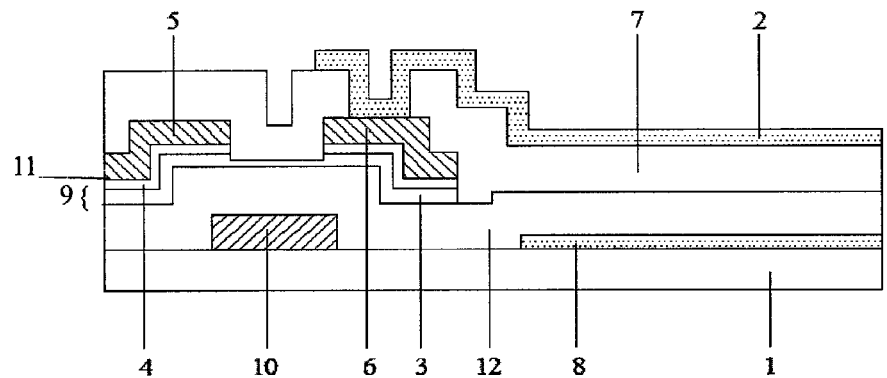
FIG. 1 is a schematic structural view of an existing ADS array substrate.

The active layer 14 in the embodiment of the present invention comprises a semiconductor layer and a doping semiconductor layer, and a pattern of the active layer 14 comprises the active layer (a channel of the TFT) of the TFT; the source/drain metal layer 15 is formed with a source/drain metal film, and a pattern thereof comprises the source electrode 151, the drain electrode 152 and the data lines (not shown in FIG. 1) of the TFT and further comprises the second metal connection layer 153 provided in the second leading wire hole 21. During a forming process, a semiconductor film (comprising a semiconductor film and a doping semiconductor film) and a source/drain metal film are produced first, then by using a multi-tone mask process, the active layer 14, and the source electrode 151, the drain electrode 152 and the data lines can be formed through one patterning process (a second patterning process in the manufacturing method of the array substrate).

The insulating protection layer 16 (i.e., a passivation layer) in this embodiment covers the substrate formed with the pixel electrode layer 11, the gate metal layer 12, the gate insulating layer 13, the active layer 14 and the source/drain metal layer 15, the substrate is further formed with the second leading wire hole 21 passing through the insulating protection layer 16 and the gate insulating layer 13, and during forming, a photoresist is retained in a region corresponding to the second leading wire hole 21 in the second patterning process, then a insulating protection film is deposited, and a photoresist striping process is used to form the second leading wire hole.

The common electrode layer 17 in this embodiment comprises the common electrode 171 which is a slit electrode, and in addition, the common electrode 171 is also connected with the common electrode line 122 through the second leading wire hole 21. The common electrode 171 is formed through one patterning process (a third patterning process in the manufacturing method of the array substrate).

The gate insulating layer 13 is provided with a through hole at a position of the second leading wire hole 21, thus the second metal connection layer 153 directly contacts the common electrode line 122, in addition, the insulating protection layer 16 (i.e., the passivation layer) is also provided with a through hole in a region corresponding to the second leading wire hole 21, thus, the common electrode 171 provided above the insulating protection layer 16 directly contacts the second metal connection layer 153, and an electrical connection between the common electrode 171 and the common electrode line 122 is achieved.

Owing to the above description, the array substrate provided by the embodiment comprises, from bottom to top, the pixel electrode layer 11, the gate metal layer 12, the gate insulating layer 13, the active layer 14, the source/drain metal layer 15, the insulating protection layer 16 and the common electrode layer 17, wherein, the source/drain metal layer 15 (the drain electrode 152 of the TFT) is connected with the pixel electrode 111 through the first leading wire hole, and the common electrode 171 is connected with the common electrode line 122 through the second leading wire hole. A portion of the transparent conductive pixel electrode 111, the first metal connection layer 123 and the drain electrode 152 are maintained in the first leading wire hole 20 from bottom to top; and the transparent conductive layer 110 provided in the same layer with the pixel electrode, the common electrode line 122, the second metal connection layer 153 and a portion of the common electrode 171 are maintained in the second leading wire hole 21 from bottom to top.

In the embodiments of the present invention, through modifying a structure design of the array substrate and by using a multi-tone mask (MTM) and a photoresist lift-off technology, the array substrate can be produced only using three masks.

Figure 3:
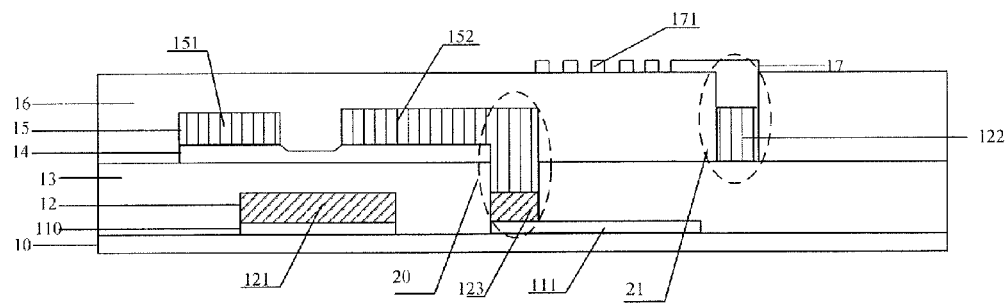
FIG. 3 is a schematic cross-sectional structural view of another array substrate provided by a first embodiment of the present invention.

In addition, optionally, as shown in FIG. 3, the common electrode line 122 in an embodiment can also be located in the source/drain metal layer 15, that is, the common electrode line 122 can also be provided in the same layer with the source electrode 151 and the drain electrode 152, and the common electrode 171 is connected with the common electrode line 122 through the second metal connection layer provided in the second leading wire hole 21.

Figure 4:
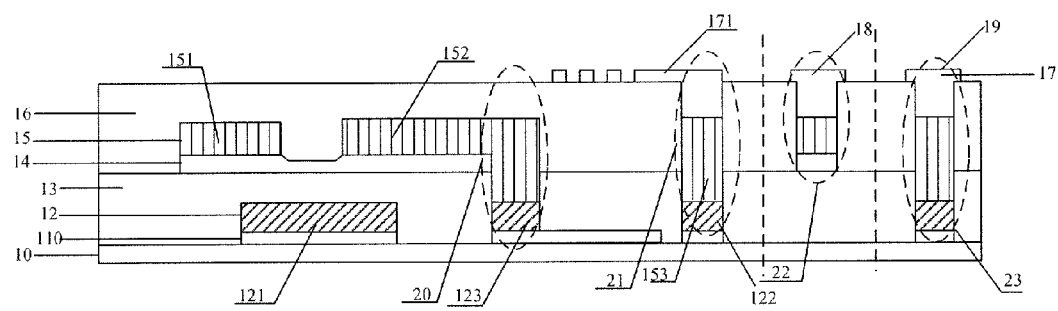
FIG. 4 is a schematic cross-sectional structural view of another array substrate provided by a first embodiment of the present invention.

Furthermore, as shown in FIG. 4, the array substrate provided by the embodiments of the present invention further comprises a source/drain leading wire terminal 18 and the gate leading wire terminal 19 provided at an edge of the array substrate, and the source/drain leading wire terminal 18 is used for a connection between the data lines and an external signal input device (not shown) and thus provides an electric signal for the data lines, and the gate leading wire terminal 19 is used for a connection between the gate lines and an external signal input device (not shown) and thus provides an electrical signal for the gate lines.

The source/drain leading wire terminal 18 is connected with the data lines through a metal connection layer provided in a source/drain leading wire hole, and the data lines and the source electrode 151 and the drain electrode 152 are provided in the same layer; the gate leading wire terminal 19 is connected with the gate lines through the second metal connection layer 153 provided in a gate leading wire hole, and the gate lines and the gate electrode 121 are provided in the same layer. Alternatively, the metal connection layer provided in the source/drain leading wire hole 22 can be a part of the corresponding data line while not a metal connection layer formed additionally, the gate leading wire hole 23 is provided with the second metal connection layer 153 and a portion of the corresponding gate line, and manufacturing processes of the source/drain leading wire hole and the gate leading wire hole are substantially the same with the second leading wire hole 21.

A manufacturing of the gate leading wire hole is the same with the second leading wire hole 21, and a photoresist is retained at a position of the gate leading wire terminal 19 through the first and the second patterning processes, and a photoresist stripping process is used to form through holes in the gate insulating layer 13 and the insulating protection layer 16; for a manufacturing of the source/drain leading wire hole, a photoresist is retained at a position of the source/drain leading wire terminal 18 through the second patterning process, and a photoresist stripping process is used to form a through hole in the insulating protection layer 16.

Finally, the formed gate leading wire terminal 19 is located above the gate lines (constituted by the transparent conductive layer of the pixel electrode layer 11 and the metal film layer of the gate metal layer 12), the source/drain metal layer 15 and the common electrode layer 17 are retained at a corresponding position of the gate leading wire terminal, thus the gate lines are extracted and connected with the external signal input device. The formed source/drain leading wire terminal 18 is located above the data lines (located at the source/drain metal layer 15), thus the data lines are extracted and then connected with the external signal input device.

Figure 5:
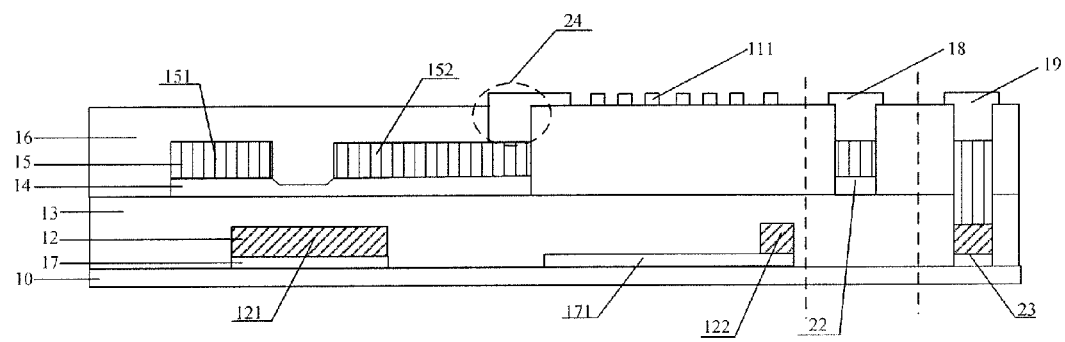
FIG. 5 is a schematic cross-sectional structural view of another array substrate provided by a first embodiment of the present invention.

The embodiments of the present invention provide another array substrate, as shown in FIG. 5, being different from the array substrate shown in FIGS. 2-4, positions of the common electrode 171 and the pixel electrode 111 are exchanged, that is, the common electrode 171 are provided on the substrate 10, and the gate electrode 121 and the common electrode line are directly provided on the common electrode layer 17; the pixel electrode 111 is provided on the insulating protection layer 16 which is provided with an insulating protection layer through hole 24, and the pixel electrode 111 is connected with the drain electrode 152 through the insulating protection layer through hole 24.

It should be further noted that a pattern of the gate metal layer 12 comprises the gate electrode 121, the gate lines (not shown) and the common electrode line 122, and the common electrode line 122 is connected with the common electrode 171 directly without a through hole formed additionally. The pixel electrode layer 11 comprises the pixel electrode 111, and the pixel electrode 111 is a slit electrode, and the common electrode 171 is a plate-shaped electrode.

Furthermore, the array substrate provided by the embodiments of the present invention further comprises a source/drain leading wire terminal 18 and a gate leading wire terminal 19 provided at an edge of the array substrate, and arranging positions and manufacturing methods thereof are the same with those shown in FIG. 4, which have been detailed and are omitted herein.

For a structure design of the another array substrate provided by the embodiments of the present invention, the common electrode layer 17 is provided on the substrate 10, the pixel electrode layer 11 is provided on the insulating protection layer 16, a multi-tone mask (MTM) and a photoresist lift-off technology are also used, and thus, the array substrate can be produced only using three masks.

For the array substrate provided by the embodiments of the present invention, the number of the patterning processes used during the production is reduced, thus the production cost is lowered effectively and the yield is improved.

A Second Embodiment

The second embodiment of the present invention further provides a display device comprising any of the array substrates according to the first embodiment. The display device can be any product or member having a display function, such as a liquid crystal panel, an electronic paper, an OLED panel, a mobile phone, a flat computer, a television, a display, a notebook computer, a digital photo frame and a navigator.

For the display device provided by the embodiments of the present invention, the number of the patterning processes used during the production of the used array substrate is reduced, thus the production cost is lowered effectively and the yield is improved.

A Third Embodiment

Figure 6:
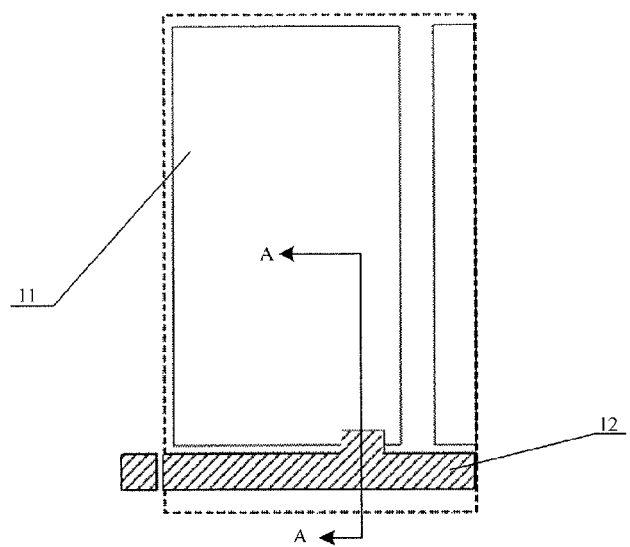
FIGS. 6(a) and (b) are respectively a schematic structural plan view and a schematic cross-sectional structural view along line A-A of a substrate after exposing and etching in a first patterning process according to a second embodiment of the present invention.
Figure 6:
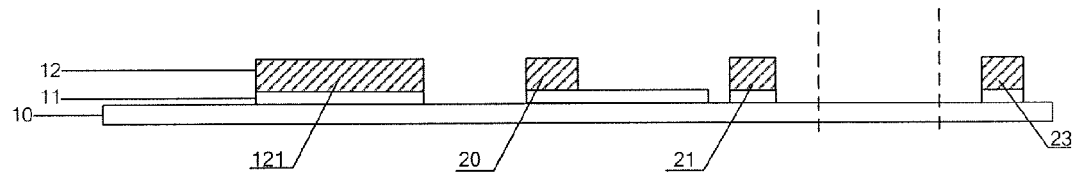

The third embodiment of the present invention further provides a manufacturing method of an array substrate, comprising:

101, forming a pixel electrode, a gate electrode, a first metal connection layer, a common electrode line, a gate insulating layer, an active layer and a first leading wire hole 20 and a second leading wire hole 21 through a first patterning process;

as shown in FIGS. 6(a)-6(b), a transparent conductive film and a gate metal film are deposited on the substrate 10, then a multi-tone mask process is used to expose different regions and etch different regions so as to form a pattern of a pixel electrode layer 11 (comprising the pixel electrode 111) and a pattern of a gate metal layer 12, the pattern of the gate metal layer 12 comprises the gate electrode 121, a gate line, the first metal connection layer 123 in the first leading wire hole 20 and the common electrode line 122, and the common electrode line partly extends to a position corresponding to the subsequently fainted second leading wire hole 21. In addition, a photoresist is retained at positions corresponding to the first leading wire hole 20 where a subsequently formed drain electrode is connected with the pixel electrode.

Exemplarily, for the array substrate shown in FIGS. 2 and 4, the common electrode line 122 is located in the gate metal layer 12, and the common electrode 171 and the common electrode line 122 are connected through the second metal connection layer 153 (located at the source/drain metal layer 15) in the second leading wire hole 21. Therefore, in the first patterning process of step 101, a photoresist needs to be retained at a position corresponding to the second leading wire hole 21 where the common electrode layer is connected with the gate metal layer 12, so as to form a through hole at a position of the gate insulating layer corresponding to the second leading wire hole 21. For the array substrate shown in FIG. 3, the common electrode line 122 is located in the source/drain metal layer 15, and a through hole needs not be provided in the gate insulating layer corresponding to a position of the second leading wire hole 21, thus the photoresist needs not be retained at the position corresponding to the second leading wire hole in the first patterning process of the step 101.

Then, the gate insulating layer and a semiconductor layer are formed on the substrate which is formed with the pattern of the pixel electrode layer 11 and the pattern of the gate metal layer 12, and is retained with the photoresist at preset positions where the first leading wire hole 20 and the second leading wire hole 21 are subsequently formed, and then, a lift-off process is used to remove the remaining photoresist in a region corresponding to a third thickness and the gate insulating layer and the semiconductor layer above it, so as to form the first leading wire hole 20 and the second leading wire hole 21.

Figure 7:
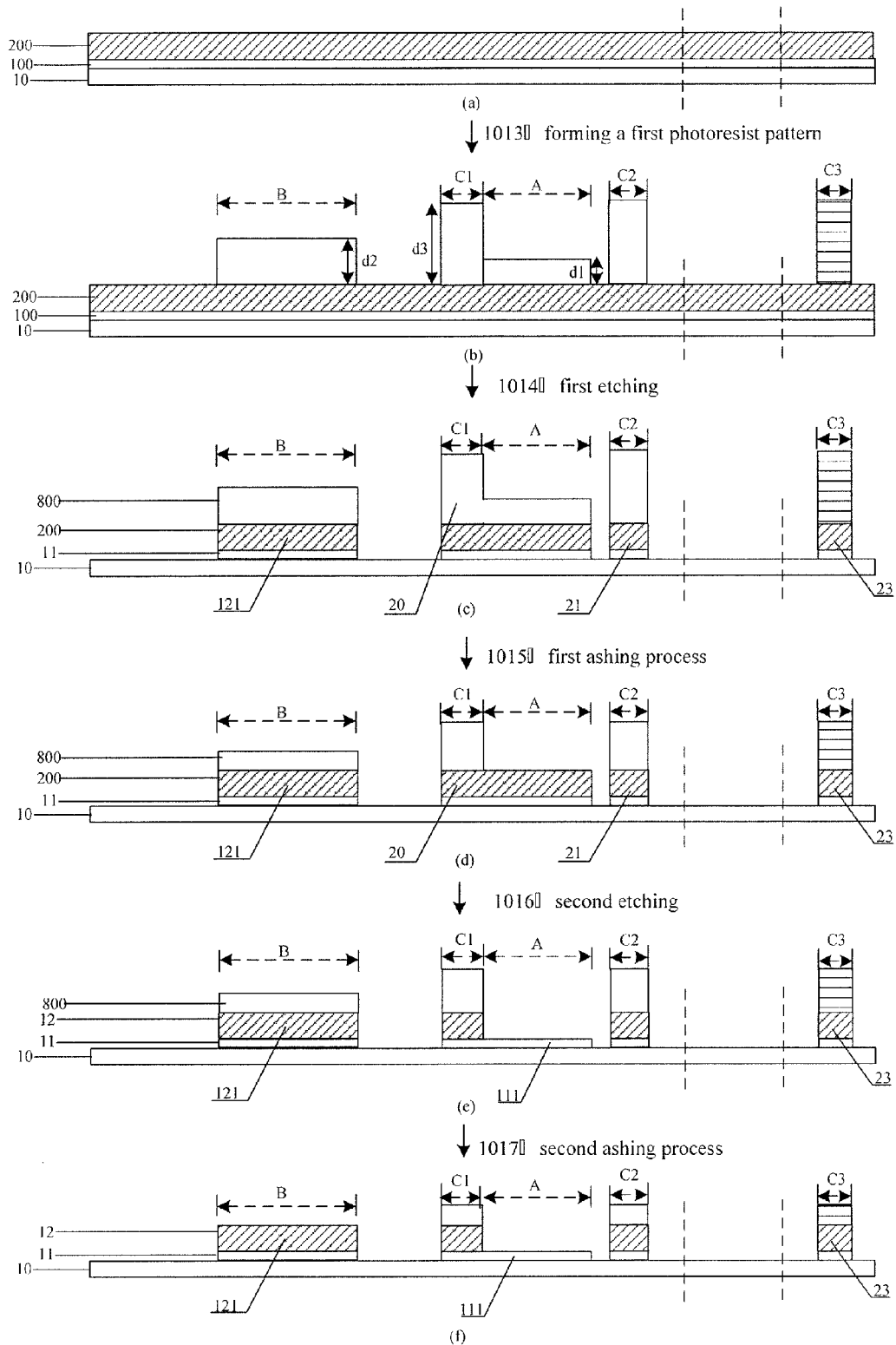
FIGS. 7(a)-(f) are schematic cross-sectional views along line A-A of an substrate in steps of the first patterning process according to a second embodiment of the present invention.

Exemplarily, the first patterning process in step 101 can comprise the following steps:

1011, forming a first transparent conductive film 100 and a gate metal film 200 on a substrate sequentially, as shown in FIG. 7(*a*);

1012, coating a photoresist on the substrate with the first transparent conductive film and the gate metal film formed thereon;

1013, performing an multi-tone exposure to the substrate, and after exposing and developing, forming a first photoresist pattern shown in FIG. 7(*b*) on the substrate formed with the first transparent conductive film 100 and the gate metal film 200 so that in the first photoresist pattern, the photoresist with a first thickness d1 is formed at a preset position (corresponding to a region A in the drawing) where the pixel electrode is formed subsequently, the photoresist with a second thickness d2 is formed at a preset position (corresponding to a region B in the drawing) where the gate electrode is formed subsequently, the photoresist with a third thickness d3 is formed at a preset position (corresponding to regions C1 and C2) where the first leading wire hole 20 and the second leading wire hole 21 are formed subsequently, and the third thickness is larger than the second thickness, and the second thickness is larger than the first thickness, that is, d3>d2>d1.

The multi-tone exposure, i.e., a multi-tone mask process, refers to an exposure in which after coating the photoresist on the deposited gate metal film, an exposure is performed using a multi-tone mask (MTM). Because light intensities of light transmitted through various parts of the multi-tone mask are different, exposure degrees of various corresponding parts of the photoresist are also different, then through the developing, a photoresist pattern with different thicknesses can be obtained, referring to the first photoresist pattern shown in FIG. 7(*b*).

For the array substrate shown in FIG. 4, the common electrode line 122 is located in the gate metal layer 12, in the first patterning process the photoresist needs to be retained at a position (the region C2 in the drawing) corresponding to the second leading wire hole 21 and in a region (a region C3 in the drawing) corresponding to a gate leading wire hole 23 at an edge of the substrate, and a thickness of the photoresist is also d3, as shown in FIG. 7(*b*). For the array substrate shown in FIG. 3, the common electrode line 122 is located in the source/drain metal layer 15, and in the first patterning process the photoresist needs not be retained at the position (the region C2 in the drawing) corresponding to the second leading wire hole 21.

1014, Etching the substrate (a first etching) to remove the exposed first transparent conductive film and the gate metal film, as shown in FIG. 7(*c*).

For the array substrate shown in FIG. 4, the etching in this step removes the first transparent conductive film 100 and the gate metal film 200 in regions not covered with the first photoresist pattern, that is, removes the first transparent conductive film 100 and the gate metal film 200 in regions other than regions in which the gate electrode 121, the gate line, the pixel electrode and the common electrode line are sequentially disposed. In the step, an etching solution is first used to etch away the gate metal film 200 in regions not covered with the photoresist, then another etching solution is used to etch a pixel electrode film (the first transparent conductive film 100) at the same place to obtain a pattern of the gate electrode.

1015, performing an ashing treatment (a first ashing treatment) to the substrate to remove the photoresist with the first thickness, as shown in FIG. 7(*d*).

In the step, the photoresist is subjected to an ashing treatment to thin the first photoresist pattern, so that the photoresist in the region (the region A) where subsequently formed the pixel electrode 111 is disposed is completely removed, and the photoresist in a region of the gate metal layer (the region B) and a region of the first leading wire hole 20 (for the array substrate shown in FIG. 4, it further comprises the regions C2 and C3) is retained, as shown in FIG. 7(*d*);

Optionally, in the step, a plasma is used to ash the photoresist to remove completely the photoresist at the thinnest positions (in the region A) and thin the photoresist at the other regions (the regions B and the regions C1, C2 and C3).

1016, etching the substrate (a second etching) to remove the exposed gate metal film;

In the step, the region of the pixel electrode layer (the region A) is etched until the first transparent conductive film is exposed and thus, the pixel electrode 111 is formed, as shown in FIG. 7(*e*).

Optionally, in the step, an etching solution is used to etch the gate metal film 200 not covered with the photoresist in the region (the region A) after performing a treatment in the step 1015, and the pattern of the pixel electrode 111 is thus obtained.

1017, performing an ashing treatment to the substrate (a second ashing treatment) to remove the remaining photoresist in the region corresponding to the second thickness.

In the step, the photoresist is subjected to the ashing treatment again, and the first photoresist pattern is further thinned, so that the photoresist in the region of the gate metal layer (the region B) is completely removed, while the photoresist in the regions of the first leading wire hole 20, the second leading wire hole 21 and the gate leading wire hole 23 is retained, as shown in FIG. 7(*f*).

It needs to be noted that, taking the array substrate shown in FIG. 4 as an example, the common electrode line is located in the gate metal layer 12, thus, the photoresist needs to be retained at the position (the region C2) corresponding to the second leading wire hole 21 where the common electrode layer is connected with the gate metal layer 12 after the second ashing treatment in step 1017. For the array substrate shown in FIG. 3, the common electrode line is located in the source/drain metal layer 15, and the photoresist needs not be retained at the position corresponding to the second leading wire hole 21 after the second ashing treatment in step 1017 in the first patterning process.

Figure 8:
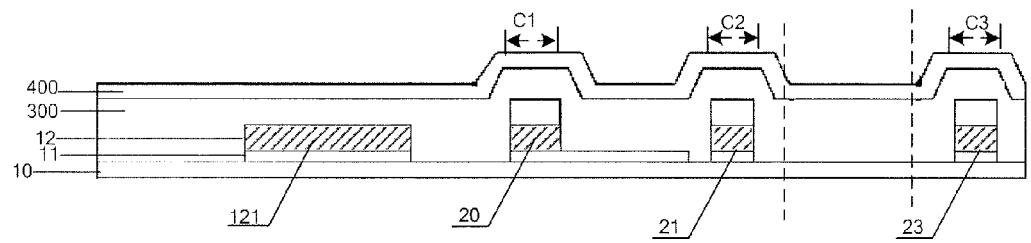
FIG. 8 is a schematic cross-sectional view along line A-A of a substrate on which a gate insulating film and a semiconductor film sequentially are formed during the first patterning process according to a second embodiment of the present invention.

1018, forming a gate insulating layer 300 and a semiconductor layer 400;

As shown in FIG. 8, in the step the gate insulating layer 300 and the semiconductor layer 400 are sequentially formed on the substrate which is formed with the pixel electrode layer 11 and the gate metal layer 12 and is retained with the photoresist at the positions corresponding to the first leading wire hole 20, the second leading wire hole 21 and the gate leading wire hole 23.

1019, removing the remaining photoresist in the region corresponding to the third thickness and the gate insulating layer 300 and the semiconductor layer 400 above it using a lift-off process to form an active layer, the first leading wire hole 20 and the second leading wire hole 21.

Figure 9:
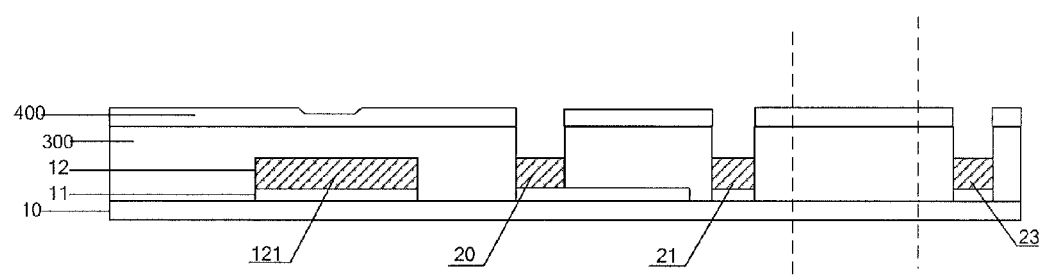
FIG. 9 is a schematic cross-sectional view along line A-A of a substrate after a photoresist lift-off process during the first patterning process according to a second embodiment of the present invention.

As shown in FIG. 9, in the step a photoresist stripping process is used to remove the photoresist retained at the positions corresponding to the first leading wire hole 20, the second leading wire hole 21 and the gate leading wire hole 23, so that the gate insulating layer 300 and the semiconductor layer 400 at the positions corresponding to the first leading wire hole 20, the second leading wire hole 21 and the gate leading wire hole 23 are also removed.

In the above steps, the array substrate shown in FIG. 4 is taken as an example for description, for the array substrate shown in FIG. 3, after step 1017, the gate insulating layer 300 and the semiconductor layer 400 are sequentially formed on the substrate which is formed with the pixel electrode layer 11 and the gate metal layer 12 and is retained with the photoresist at the positions corresponding to the first leading wire hole 20 and the gate leading wire hole 23; in step 1019, the photoresist at the positions corresponding to the first leading wire hole 20 and the gate leading wire hole 23 are removed by using a lift-off process, so that the gate insulating layer 300 and the semiconductor layer 400 at the positions corresponding to the first leading wire hole 20 and the gate leading wire hole 23 are also removed.

As mentioned above, the pixel electrode 111 and the gate electrode 121 can be formed through one patterning process (the first patterning process).

Figure 10:
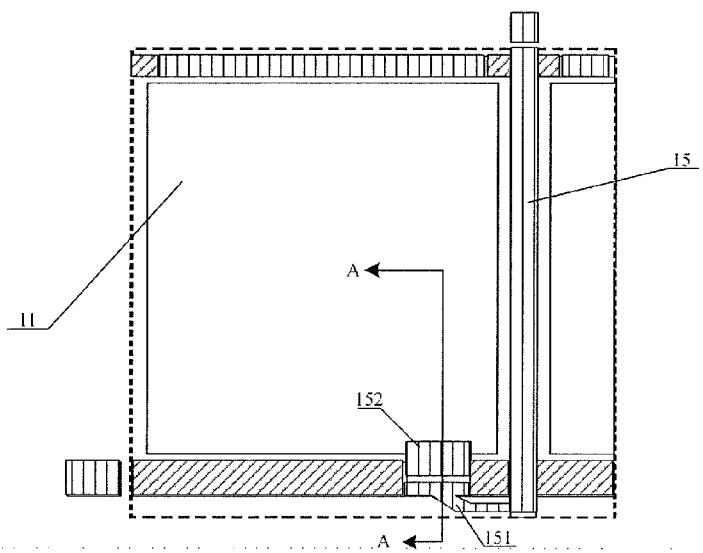
FIGS. 10(a) and (b) are schematic cross-sectional views along line A-A of a substrate after a second patterning process according to a second embodiment of the present invention.
Figure 10:
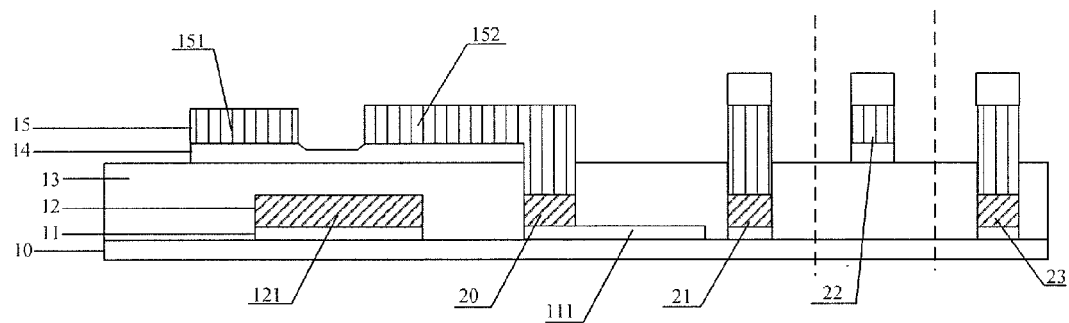

102, as shown in FIGS. 10(*a*)-(*b*), forming a source electrode 151, a drain electrode 152, a second metal connection layer and the insulating protection layer (not shown) through a second patterning process, and the drain electrode 152 being connected with the pixel electrode 111 through the first metal connection layer provided in the first leading wire hole 20.

Figure 11:
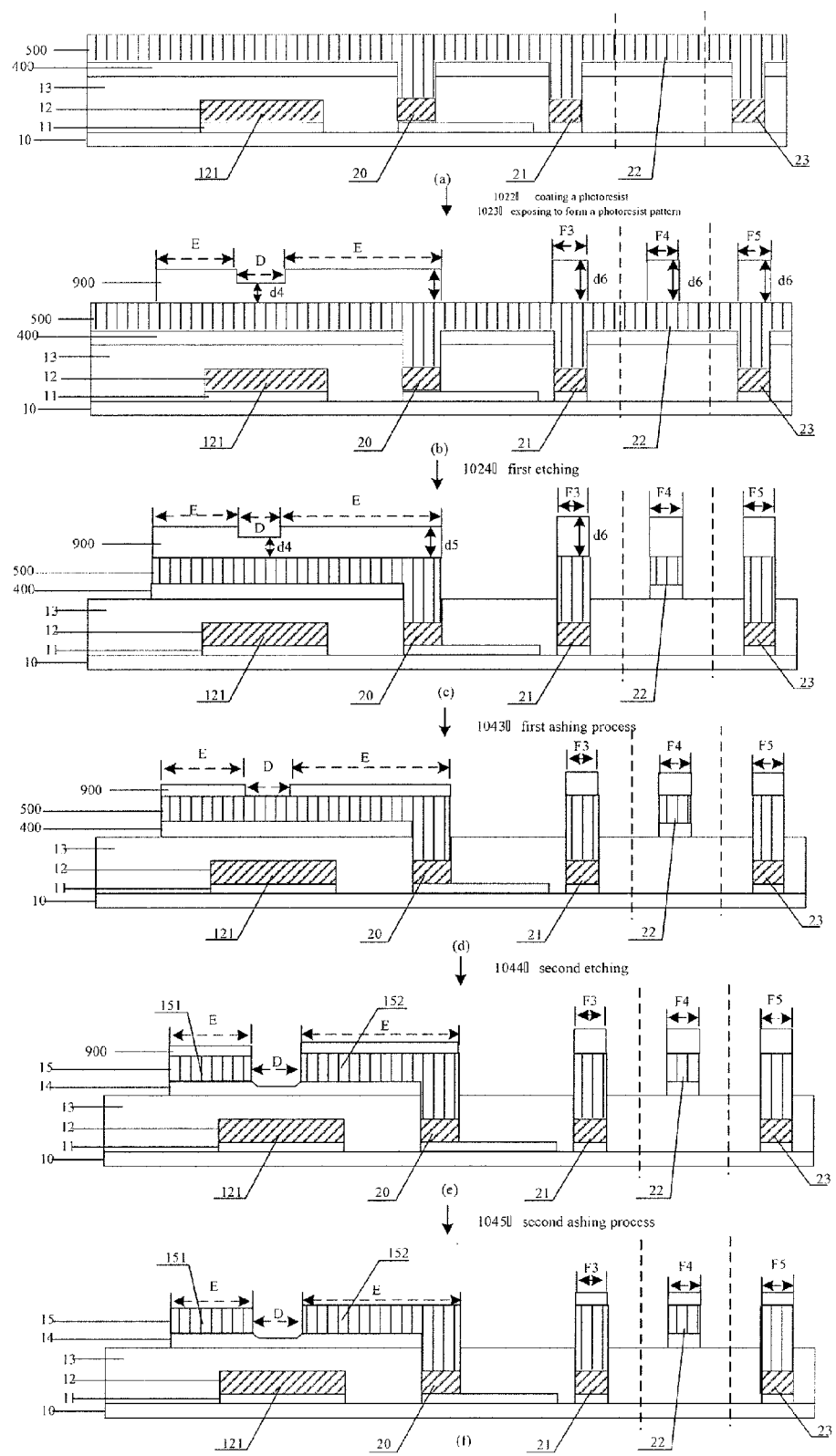
FIGS. 11(a)-(f) are schematic cross-sectional views along line A-A of a substrate in steps 1021-1027 of the second patterning process according to a second embodiment of the present invention.

Exemplarily, taking the array substrate shown in FIG. 3 or 4 as an example, in step 102, a photoresist is retained at positions corresponding to a source/drain leading wire hole 22 and the gate leading wire hole 23, and this step comprises:

1021, forming a source/drain metal layer 500, as shown in FIG. 11(*a*);

In the step, the source/drain metal layer 500 is formed on the substrate formed with the pixel electrode layer 11, the gate metal layer 12, the gate insulating layer 13 and the semiconductor layer 400.

1022, coating a photoresist on the substrate formed with the source/drain metal layer 500;

1023, performing a multi-tone exposure to the substrate and after exposing and developing, forming a photoresist with a fourth thickness d4 at a preset position (corresponding to a region D in the drawing) where a channel will be formed subsequently, forming a photoresist with a fifth thickness d5 at a preset position (corresponding to a region E in the drawing) where a source/drain electrode will be formed subsequently, and forming a photoresist with a sixth thickness d6 at a preset position (corresponding to the region F3 in the drawing) where the second leading wire hole 21 is formed subsequently, wherein, the sixth thickness is larger than the fifth thickness, and the fifth thickness is larger than the fourth thickness, that is, d6>d5>d4.

In the step, a multi-tone mask process is used to form a second photoresist pattern 900 on the substrate formed with the source/drain metal layer 500, as shown in FIG. 11(*b*), wherein, optionally, in the second photoresist pattern 900, the photoresist with the sixth thickness d6 may also be retained at preset positions (corresponding to regions F4 and F5 in the drawing) where the source/drain leading wire hole 22 and the gate leading wire hole 23 are subsequently formed.

1024, etching the substrate (a first etching) to remove the exposed source/drain metal layer 500 and the semiconductor layer 400;

As shown in FIG. 11(*c*), the etching is performed in this step to remove the semiconductor layer 400 and the source/drain metal layer 500 in regions not covered with the photoresist, that is, remove the semiconductor layer 400 and the source/drain metal layer 500 in regions other than regions where the source/drain electrode and the TFT channel, the second leading wire hole 21, the source/drain leading wire hole 22 and the gate leading wire hole 23 are subsequently disposed (respectively corresponding to the regions D, E, F3, F4 and F5 in the drawing).

1025, performing an ashing treatment (a first ashing treatment in the second composition) to the substrate to remove the photoresist with the fourth thickness (i.e., in a region D) and etching the exposed part (i.e., the region D) to form the TFT channel.

In the step, the ashing treatment is performed to the photoresist to thin the second photoresist pattern 900, so that the photoresist at a preset position (the region D) where the TFT channel is subsequently disposed is completely removed, while the photoresist at the preset positions (the regions F3, F4 and F5) where the source/drain electrode (the region E), the second leading wire hole 21, the source/drain leading wire hole 22 and the gate leading wire hole 23 are subsequently formed, as shown in FIG. 11(*d*) is retained.

Then, the exposed part (the preset position where the TFT channel is formed subsequently, corresponding to the region D in the drawing) is etched away to form the TFT channel, as shown in FIG. 11(*e*). When performing the etching, an etching solution may be firstly used to etch the source/drain metal layer 500 in the channel region which is not covered by the photoresist, then a plasma etching is used to etch the semiconductor layer 400 at the same place, thus a channel pattern is obtained to formed a pattern of the TFT (Thin Film Transistor). Herein, the semiconductor layer 400 comprises a semiconductor film and a doping semiconductor film, when the plasma etching is used to etch the channel region, the etching is continued until the semiconductor film as a lower layer is exposed. And in practice, in order to ensure the doping semiconductor film being completely removed in the channel region, a part of the semiconductor film in the channel region is generally etched away.

1026, performing an ashing treatment (a second ashing treatment in the second composition) to the substrate to remove the remaining photoresist in the region (the region E) corresponding to the fifth thickness to form the source/drain electrode.

In the step, the ashing treatment is performed to the photoresist again, and the second photoresist pattern 900 is thinned, so that the photoresist in the region (the region E) where the source/drain electrode is subsequently formed is completely removed, while the photoresist in the corresponding regions (the regions F2, F3 and F5) where the second leading wire hole 21, the source/drain leading wire hole 22 and the gate leading wire hole 23 are subsequently formed is retained, as shown in FIG. 11(f);

1027, forming the insulating protection layer 600.

Figure 12:
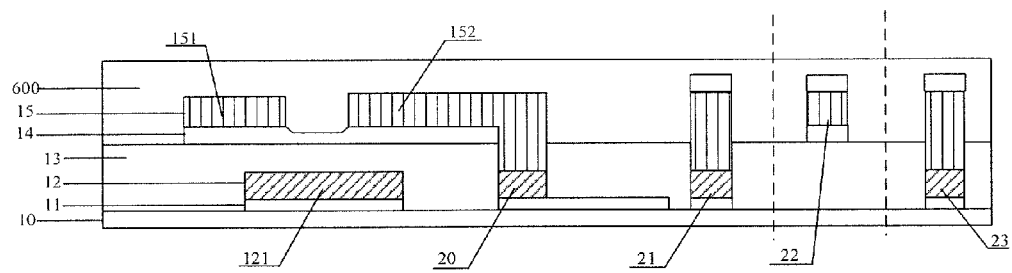
FIGS. 12(a) and (b) are schematic cross-sectional views along line A-A of a substrate formed with a insulating protection film and after a photoresist lift-off process according to a second embodiment of the present invention.
Figure 12:
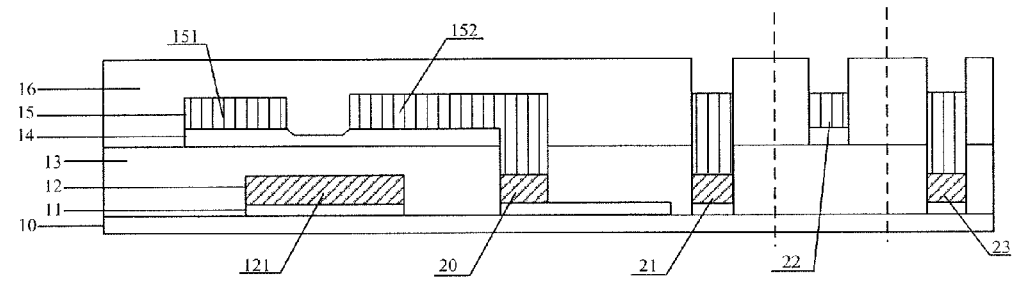

The insulating protection layer 600 is formed on the substrate which is formed with the pixel electrode layer 11, the gate metal layer 12, the gate insulating layer 13, the active layer 14 and the source/drain metal layer 15 and is retained with the photoresist at positions where the second leading wire hole 21, the source/drain leading wire hole 22 and the gate leading wire hole 23 are subsequently formed, as shown in FIG. 12(a);

1028, as shown in FIG. 12(b), removing the remaining photoresist and the insulating protection layer above it to form the second leading wire hole 21 using a lift-off process.

Removing the remaining photoresist through the lift-off process, that is, removing the photoresist retained at the preset position of the second leading wire hole 21, may further comprise: removing the photoresist retained at preset positions of the source/drain leading wire hole 22 and the gate leading wire hole 23, so that the insulating protection layer 600 at the preset positions of the second leading wire hole 21, the source/drain leading wire hole 22 and the gate leading wire hole 23 are removed, and the through holes are formed;

In step 102, the active layer 14, the source/drain metal layer 15 and the insulating protection layer 16 are formed through the second patterning process, and the insulating protection layer 16 is provided with the through holes at the preset positions of the second leading wire hole 21 where the common electrode is connected with the common electrode line, the source/drain leading wire hole 22 and the gate leading wire hole 23.

Figure 13:
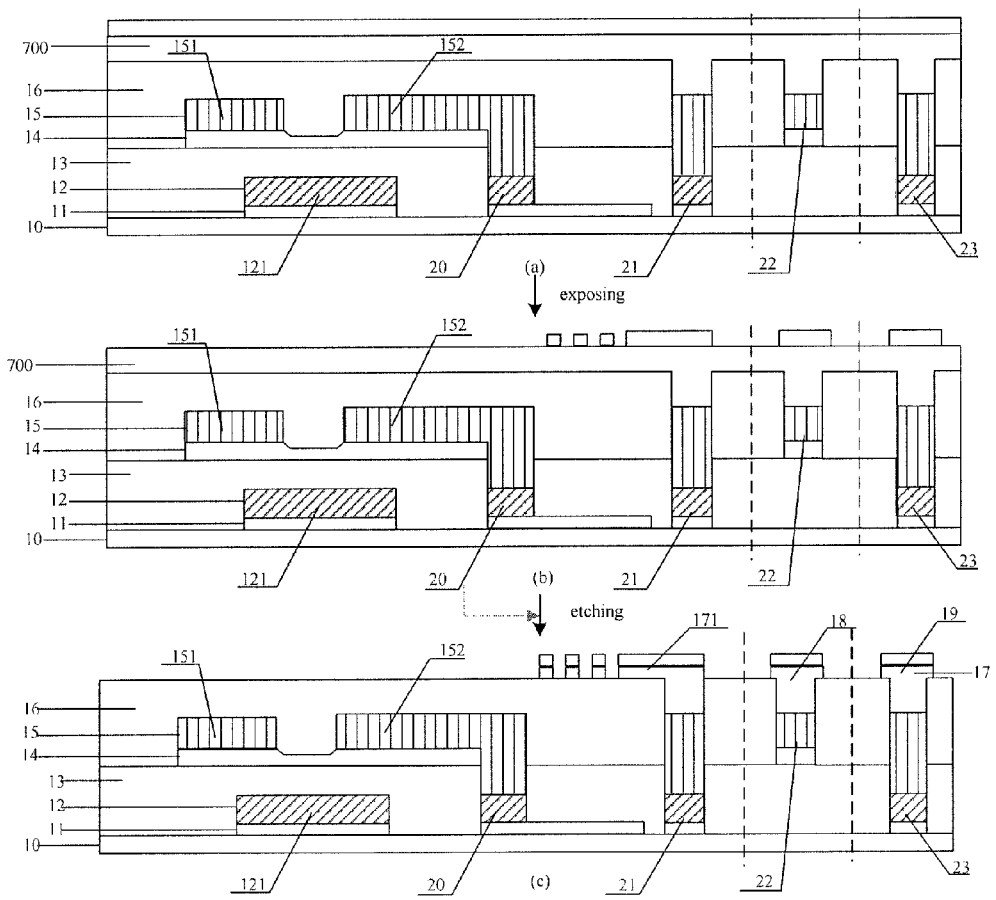
FIGS. 13(a)-(c) are schematic cross-sectional views along line A-A of a substrate during a third patterning process according to a second embodiment of the present invention.

103, as shown in FIGS. 13(a)-(c), forming the common electrode 171 through a third patterning process, wherein the common electrode 171 is connected with the common electrode line through a second metal connection layer provided in the second leading wire hole 21.

Optionally, the third patterning process in step 103 comprises the following steps:

1031, forming a second transparent conductive film;

1032, coating a photoresist on the substrate formed with the second transparent conductive film; and 1033, exposing, developing and etching the substrate to form the common electrode.

Exemplarily, depositing the second transparent conductive film 700 in step 1031 is shown in FIG. 13(a), the photoresist is coated in step 1032, a common mask is used for exposure in step 1033, and a photoresist pattern shown in FIG. 13(b) is obtained. Then, an etching solution is used to etch the second transparent conductive film 700 (which is used to form the common electrode) which is not covered by photoresist to obtain a pattern of the common electrode 171 shown in FIG. 13(c), a pattern of a storage capacitor Cs and patterns of a source/drain leading wire terminal 18 and a gate leading wire terminal 19, and finally the remaining photoresist also needs to be removed.

The manufacturing method of the array substrate provided by the embodiments uses a multi-tone mask (MTM) and a photoresist lift-off technology, and the array substrate can be manufactured only using three masks.

Although the manufacturing method of the array substrate provided by the embodiments takes the array substrate shown in FIG. 2 or 4 as an example, while is also applicable to the array substrate shown in FIG. 3, while the common electrode line of the array substrate shown in FIG. 3 is located in the source/drain metal layer 15, thus in the first patterning process of step 101, the photoresist needs not be retained at the preset position where the second leading wire hole 21 is subsequently formed, and the second leading wire hole 21 is formed without the lift-off process, either, and the other steps are the same.

The second embodiment further provides another manufacturing method of the array substrate corresponding to the array substrate shown in FIG. 5, the manufacturing method comprises:

201, forming a common electrode, a gate electrode, a common electrode line, a gate insulating layer and an active layer through a first patterning process.

Forming a first transparent conductive film and a gate metal film on a substrate sequentially, and then forming the common electrode, the gate electrode, the common electrode line, the gate insulating layer and the active layer through the first patterning process.

Figure 14:
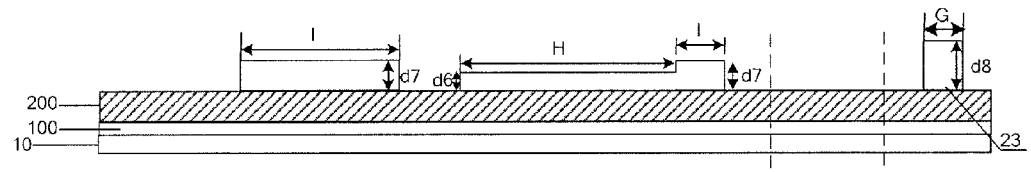
FIG. 14(a) is a photoresist pattern in the first patterning process of a manufacturing method of an array substrate shown in FIG. 5 according to a first embodiment of the present invention.
FIG. 14(b) is a schematic cross-sectional view along line A-A of the substrate after an etching of the first patterning process.
FIG. 14(c) is a schematic cross-sectional view along line A-A of the substrate after the first patterning process is completed in the manufacturing method of the array substrate shown in FIG. 5 according to a first embodiment of the present invention.
Figure 14:
Figure 14:
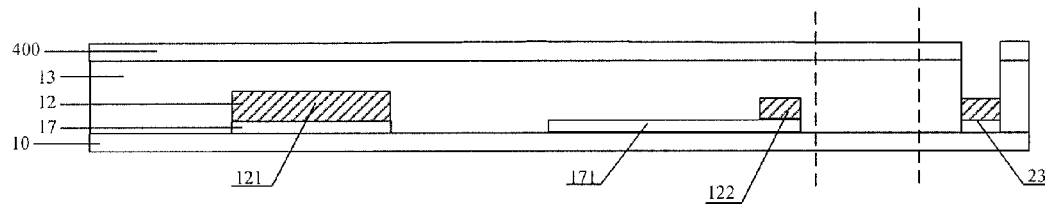

Exemplarily, the first patterning process in step 201 comprises the following steps:

2011, forming a first transparent conductive film 100 and a gate metal film 200 on the substrate;

2012, coating a photoresist on the substrate formed with the first transparent conductive film 100 and the gate metal film 200;

2013, as shown in FIG. 14(a), performing a multi-tone exposure to the substrate, and after exposing and developing, forming a photoresist with a sixth thickness d6 at a preset position (corresponding to a region H) where the common electrode is formed subsequently, forming a photoresist with a seventh thickness d7 at a preset position (corresponding to a region I) where the gate electrode and the common electrode line are formed subsequently, and the seventh thickness being larger than the sixth thickness;

In addition, optionally, in the step a photoresist (whose thickness is d8) whose thickness is larger than that of the photoresist in the region I may also be retained at a preset position (corresponding to a region G) where a gate leading wire hole 23 is formed subsequently.

2014, etching the substrate to remove the exposed first transparent conductive film 100 and the gate metal film 200.

In the step, regions other than regions (corresponding to the regions I, H and G respectively) where the gate electrode, the gate line, the common electrode line, the common electrode and the gate leading wire hole 23 are formed subsequently are etched to remove the first transparent conductive film and the gate metal film.

2015, performing an ashing treatment to remove the photoresist with the sixth thickness (in the region H).

In the step, the photoresist is subjected to the ashing treatment to thin the photoresist pattern, so that the photoresist in a region (the region H) where the common electrode is formed subsequently is completely removed and the photoresist at a preset position (in the region I) where the gate electrode is subsequently formed is retained. In addition, optionally, the photoresist is also retained at a preset position (the region G) where the gate leading wire hole 23 is formed subsequently.

2016, etching the exposed part to remove the exposed gate metal film and form the common electrode.

As shown in FIG. 14(b), in the step a region of the common electrode layer (the region H) is etched until the first transparent conductive film 200 is exposed to form the common electrode 171.

2017, performing the ashing treatment to the substrate to remove the remaining photoresist in the region (the region I) corresponding to the seventh thickness and thus, form the gate electrode and the common electrode line.

Optionally, in the step the photoresist at the preset position (in the region G) where the gate leading wire hole 23 is subsequently formed is retained, so that after step 2018, a lift-off process is used to remove a gate insulating layer and a semiconductor layer to form the gate leading wire hole 23.

2018, depositing a gate insulating layer 13 and a semiconductor layer 400.

As shown in FIG. 14(c), in the step the gate insulating layer 13 and the semiconductor layer 400 are deposited on the substrate formed with the common electrode layer 17, the gate metal layer 12, the gate insulating layer 13 and the semiconductor layer 400.

After the first patterning process, the gate metal layer 12 formed in the embodiment comprises the gate line and the gate electrode 121 and further comprises the common electrode line 122, and the formed common electrode layer 17 comprises the common electrode 171. The gate metal layer 12 is directly provided on the common electrode layer 17, thus the common electrode line 122 is directly connected with the common electrode 171 electrically.

Figure 15:
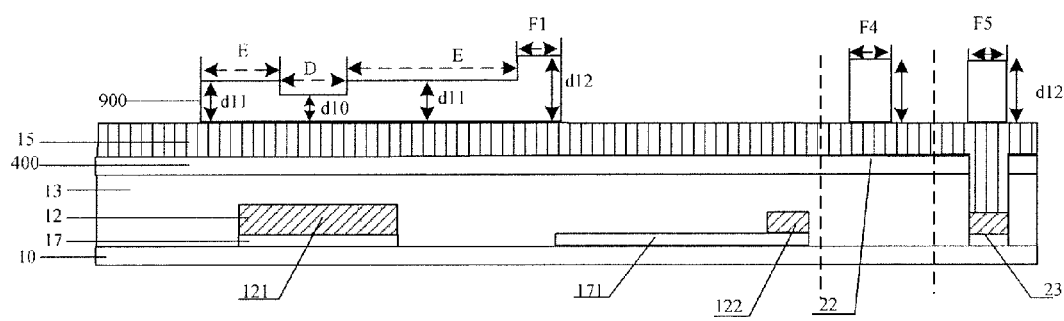
FIG. 15(a) is a photoresist pattern in a second patterning process of a manufacturing method of an array substrate shown in FIG. 5 according to a first embodiment of the present invention.
FIG. 15(b) is a schematic cross-sectional view along line A-A of the substrate after etching.
Figure 15:
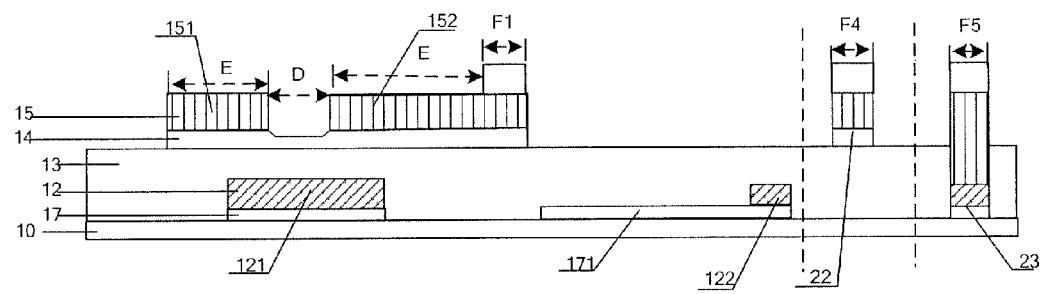
Figure 16:
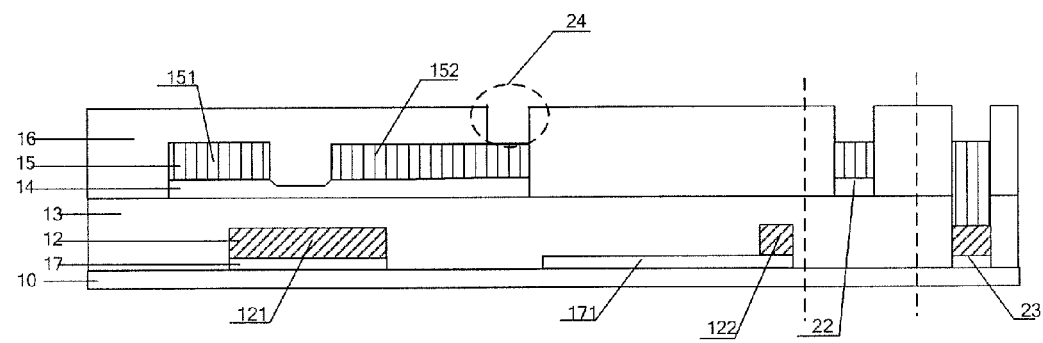
FIG. 16 is a schematic cross-sectional view along line A-A of a substrate after a second patterning process in the manufacturing method of the array substrate shown in FIG. 5 according to a first embodiment of the present invention.

202, as shown in FIGS. 15(a)-(b) and FIG. 16, forming a source electrode 151, a drain electrode 152 and a insulating protection layer 16 through a second patterning process, and the insulating protection layer 16 being provided with an insulating protection layer through hole 24.

Optionally, the second patterning process of step 202 comprises following steps:

2021, forming a source/drain metal layer 15;

2022, coating a photoresist 900 on the substrate formed with the source/drain metal layer 15;

2023, performing a multi-tone exposure to the substrate, and after exposing and developing, as shown in FIG. 15(a), forming a photoresist with a tenth thickness d10 at a preset position (region D) where a TFT channel is formed subsequently, forming a photoresist with an eleventh thickness d11 at a preset position (region E) where the source/drain electrode is formed subsequently, and forming a photoresist with a twelfth thickness at a preset position (region F1) where the insulating protection layer through hole is formed subsequently, wherein, the twelfth thickness is larger than the eleventh thickness, and the eleventh thickness is larger than the tenth thickness.

The following steps 2024-2026 are described with reference to FIG. 15(b).

2024, etching the substrate to remove the exposed source/drain metal layer 15 and the semiconductor layer 400.

In the step the substrate is etched, the exposed part (in a region other than the regions D, E, F1, F4 and F5) of the source/drain metal layer 15 and the semiconductor layer 400 is removed, and thus, the gate insulating layer 13 is exposed.

2025, performing an ashing treatment to the substrate to remove the photoresist with the tenth thickness (in the region D) and etching the exposed part (in the region D) to form the TFT channel;

2026, performing an ashing treatment to remove the remaining photoresist in the region (region E) corresponding to the eleventh thickness to form the source electrode 151 and the drain electrode 152.

Optionally, in the step the photoresist may be retained in the region (region F3) where a source/drain leading wire hole 22 is subsequently formed and the region (the region F4) where the gate leading wire hole 22 is subsequently formed.

The following steps 2027 and 2028 are described with reference to FIG. 16.

2027, forming the insulating protection layer.

In this step the insulating protection layer 16 is formed on the substrate which is formed with the common electrode layer 17, the gate metal layer 12, the gate insulating layer 13, the semiconductor layer 14 and the source/drain metal layer 15 and is retained with the photoresist at a preset position where the insulating protection layer through hole is subsequently formed; and 2028, as shown in FIG. 16, removing the remaining photoresist and the insulating protection layer 16 above it to form an insulating protection layer through hole 24 using a lift-off process.

In the step, a photoresist lift-off process is used to remove the photoresist retained at the position corresponding to the insulating protection layer through hole 24, so that the insulating protection layer 16 at the position corresponding to the insulating protection layer through hole 24 is also removed and the insulating protection layer through hole 24 is formed at the corresponding position above the source electrode of the TFT.

203, as shown in FIG. 5, forming a pixel electrode 111 through a third patterning process, wherein the pixel electrode 111 is connected with the drain electrode 152 through the insulating protection layer through hole 24.

In the step, a second transparent conductive film is formed; a photoresist is coated on the substrate formed with the second transparent conductive film; the substrate is exposed, developed and etched, and the pixel electrode is formed.

The embodiments of the present invention provide an array substrate and a manufacturing method thereof and a display device, in which a gate metal layer (a layer in which a gate electrode is located) is directly provided on a transparent conductive layer which is provided in the same layer with a pixel electrode layer; during manufacturing, a first transparent conductive film and a gate metal film are first formed sequentially, then a pixel electrode and the gate electrode are formed through a multi-tone mask (MTM) process by using one patterning process (a first patterning process), and then a photoresist lift-off technology is performed to form a first leading wire hole after forming a gate insulating layer to connect a drain electrode with the pixel electrode; a second patterning process is used to form an active layer, a source electrode and the drain electrode, during forming a insulating protection layer above the source electrode and the drain electrode, the photoresist lift-off technology is again used to form a second leading wire hole to connect a common electrode line and the common electrode, wherein the common electrode line and the gate electrode are provided in the same layer, or the common electrode line and the source electrode and the drain electrode are provided in the same layer; a third patterning process is used to form the common electrode, thus the array substrate can be manufactured only using three masks, then the number of the patterning processes during producing the array substrate can be reduced, and the production cost can be effectively lowered and the yield can be improved.

In the manufacturing method of the array substrate provided by the embodiments, the MTM and the photoresist lift-off technology are used, and the array substrate can be produced using three masks, and compared with the prior art, the number of the patterning processes during producing the array substrate can be reduced, and the production cost can be effectively lowered and the yield can be improved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. An array substrate, comprising:
   a substrate;
   a gate electrode, a gate insulating layer, an active layer, a source electrode, a drain electrode and an insulating protection layer, sequentially formed on the substrate,
   wherein the substrate is further provided with a pixel electrode, a common electrode, and a first leading wire hole connecting the pixel electrode with the drain electrode and a second leading wire hole connecting the common electrode with a common electrode line,
   the pixel electrode is provided on the substrate, and the gate electrode is directly provided on a transparent conductive layer which is provided in the same layer with the pixel electrode,
   the pixel electrode is connected with the drain electrode through a first metal connection layer provided in the first leading wire hole, and the first metal connection layer is provided in the same layer with the gate electrode.

2. The array substrate according to claim 1, wherein the common electrode line and the gate electrode are provided in the same layer, and
   the common electrode and the common electrode line are connected through a second metal connection layer provided in the second leading wire hole, and the second metal connection layer and the source electrode and the drain electrode are provided in the same layer.

3. The array substrate according to claim 2, wherein the first metal connection layer is formed on a transparent conductive layer having the same pattern with it, and the common electrode line is formed on a transparent conductive layer having the same pattern with it.

4. The array substrate according to claim 1, wherein the common electrode line and the source electrode and the drain electrode are provided in the same layer, and
   the common electrode and the common electrode line are connected through a metal provided in the second leading wire hole.

5. The array substrate according to claim 4, wherein the metal in the second leading wire hole is a part of the common electrode line.

6. The array substrate according to claim 1, further comprising: a source/drain leading wire terminal and a gate leading wire terminal provided at an edge of the array substrate,
   wherein the source/drain leading wire terminal is connected with a data line through a metal connection layer provided in a source/drain leading wire hole, and the data line and the source electrode and the drain electrode are provided in the same layer; and
   the gate leading wire terminal is connected with a gate line through the second metal connection layer provided in a gate leading wire hole, and the gate line and the gate electrode are provided in the same layer, and the second metal connection layer and the source electrode and the drain electrode are provided in the same layer.

7. The array substrate according to claim 6, wherein the metal connection layer in the source/drain leading wire hole is a part of corresponding data line.

8. The array substrate according to claim 1, wherein a pattern of the transparent conductive layer below the gate line is the same with the gate line.

9. A manufacturing method of an array substrate, comprising:
   forming a pixel electrode, a gate electrode, a first metal connection layer, a gate insulating layer, an active layer and a first leading wire hole through a first patterning process;
   forming a source electrode, a drain electrode, a second metal connection layer and an insulating protection layer through a second patterning process, and the drain electrode being connected with the pixel electrode through the first metal connection layer provided in the first leading wire hole; and
   forming through a third patterning process a common electrode which is connected with a common electrode line through the second metal connection layer provided in a second leading wire hole.

10. The manufacturing method according to claim 9, wherein each of the first patterning process and the second patterning process comprises a multi-tone mask process and a lift-off technology.

11. The method according to claim 9, wherein the second leading wire hole and the common electrode line are formed in the first patterning process, and the first patterning process comprises the following steps:
   forming a first transparent conductive film and a gate metal film;
   coating a photoresist on a substrate with the first transparent conductive film and the gate metal film formed thereon;
   performing a multi-tone exposure to the substrate with a multi-tone mask, and after exposing and developing, forming a first photoresist pattern on the substrate formed with the first transparent conductive film and the gate metal film so that in the first photoresist pattern, a photoresist with a first thickness is formed at a preset position where the pixel electrode is formed subsequently, a photoresist with a second thickness is formed at a preset position where the gate electrode is formed subsequently, and a photoresist with a third thickness is formed at preset positions where the first leading wire hole, the common electrode line and the second leading wire hole are formed subsequently, and the third thickness is larger than the second thickness, and the second thickness is larger than the first thickness;

etching the substrate to remove the exposed first transparent conductive film and gate metal film;
performing an ashing treatment to the substrate to remove the photoresist with the first thickness;
etching the substrate to remove the exposed gate metal film and thus form the pixel electrode;
performing an ashing treatment to the substrate to remove the remaining photoresist in a region corresponding to the second thickness;
forming a gate insulating layer and a semiconductor layer; and
removing the remaining photoresist in a region corresponding to the third thickness and the gate insulating layer and the semiconductor layer above it to form the active layer, the first leading wire hole and the second leading wire hole using a lift-off process.

12. The manufacturing method according to claim 11, wherein the second patterning process comprises following steps:
forming a source/drain metal layer;
coating a photoresist on the substrate formed with the source/drain metal layer;
performing a multi-step exposure to the substrate with a multi-tone mask, and after exposing and developing, forming a photoresist with a fourth thickness at a preset position where a TFT channel is formed subsequently, forming a photoresist with a fifth thickness at a preset position where a source/drain electrode is formed subsequently, and forming a photoresist with a sixth thickness at a preset position where the second leading wire hole is formed subsequently, wherein, the sixth thickness is larger than the fifth thickness, and the fifth thickness is larger than the fourth thickness;
etching the substrate to remove the exposed source/drain metal layer and the semiconductor layer;
performing an ashing treatment to the substrate to remove the photoresist with the fourth thickness and etching the exposed part to form the TFT channel;
performing an ashing treatment to the substrate to remove the remaining photoresist in a region corresponding to the fifth thickness to form the source/drain electrode;
forming an insulating protection layer; and
removing the remaining photoresist and the insulating protection layer above it to form the second leading wire hole using a lift-off process.

13. The method according to claim 9, wherein the second patterning process comprises following steps:
forming a source/drain metal layer;
coating a photoresist on the substrate formed with the source/drain metal layer;
performing a multi-tone exposure to the substrate with a multi-tone mask, and after exposing and developing, forming a photoresist with a fourth thickness at a preset position where a TFT channel is formed subsequently, forming a photoresist with a fifth thickness at a preset position where a source/drain electrode is formed subsequently, and forming a photoresist with a sixth thickness at a preset position where the second leading wire hole is formed subsequently, wherein, the sixth thickness is larger than the fifth thickness, and the fifth thickness is larger than the fourth thickness;
etching the substrate to remove the exposed source/drain metal layer and the semiconductor layer;
performing an ashing treatment to the substrate to remove the photoresist with the fourth thickness and etching the exposed part to form the TFT channel;
performing an ashing treatment to the substrate to remove the remaining photoresist in a region corresponding to the fifth thickness to form the source/drain electrode;
forming an insulating protection layer; and
removing the remaining photoresist and the insulating protection layer above it to form the second leading wire hole using a lift-off process.

14. The manufacturing method according to claim 9, wherein the third patterning process comprises the following steps:
forming a second transparent conductive film;
coating a photoresist on the substrate formed with the second transparent conductive film; and
performing exposing, developing and etching processes to form the common electrode.

15. The manufacturing method according to claim 9, wherein the first patterning process comprises following steps:
forming a first transparent conductive film and a gate metal film;
coating a photoresist on the substrate with the first transparent conductive film and the gate metal film formed thereon;
performing a multi-tone exposure to the substrate with a multi-tone mask, and after exposing and developing, forming a first photoresist pattern on the substrate formed with the first transparent conductive film and the gate metal film so that in the first photoresist pattern, a photoresist with a first thickness is formed at a preset position where the pixel electrode is formed subsequently, a photoresist with a second thickness is formed at a preset position where the gate electrode is formed subsequently, and a photoresist with a third thickness is formed at a preset position where the first leading wire hole is formed subsequently, and the third thickness is larger than the second thickness, and the second thickness is larger than the first thickness;
etching the substrate to remove the exposed first transparent conductive film and gate metal film;
performing an ashing treatment to the substrate to remove the photoresist with the first thickness;
etching the substrate to remove the exposed gate metal film and form the pixel electrode;
performing an ashing treatment to the substrate to remove the remaining photoresist in a region corresponding to the second thickness;
forming a gate insulating layer and a semiconductor layer; and
removing the remaining photoresist in a region corresponding to the third thickness and the gate insulating layer and the semiconductor layer above it to form the active layer and the first leading wire hole using a lift-off process.

16. The manufacturing method according to claim 15, wherein the second leading wire hole and the common electrode line are formed in the second patterning process, and the second patterning process comprises following steps:
forming a source/drain metal layer;
coating a photoresist on the substrate formed with the source/drain metal layer;
performing a multi-step exposure to the substrate with a multi-tone mask, and after exposing and developing, forming a photoresist with a fourth thickness at a preset position where a TFT channel is formed subsequently, forming a photoresist with a fifth thickness at a preset position where a source/drain electrode is formed subsequently, and forming a photoresist with a sixth thickness at preset positions where the common electrode line and the second leading wire hole are formed subsequently, wherein, the sixth thickness is larger than the fifth thickness, and the fifth thickness is larger than the fourth thickness;

etching the substrate to remove the exposed source/drain metal layer and the semiconductor layer;

performing an ashing treatment to the substrate to remove the photoresist with the fourth thickness and etching the exposed part to form the TFT channel;

performing an ashing treatment to the substrate to remove the remaining photoresist in a region corresponding to the fifth thickness and form the source/drain electrode;

forming an insulating protection layer; and removing the remaining photoresist and the insulating protection layer above it to form the second leading wire hole using a lift-off process.

17. The manufacturing method according to claim 9, wherein the second leading wire hole and the common electrode line are formed in the second patterning process, and the second patterning process comprises following steps:

forming a source/drain metal layer;

coating a photoresist on the substrate formed with the source/drain metal layer;

performing a multi-tone exposure to the substrate with a multi-tone mask, and after exposing and developing, forming a photoresist with a fourth thickness at a preset position where a TFT channel is formed subsequently, forming a photoresist with a fifth thickness at a preset position where a source/drain electrode is formed subsequently, and forming a photoresist with a sixth thickness at preset positions where the common electrode line and the second leading wire hole are formed subsequently, wherein, the sixth thickness is larger than the fifth thickness, and the fifth thickness is larger than the fourth thickness;

etching the substrate to remove the exposed source/drain metal layer and the semiconductor layer;

performing an ashing treatment to the substrate to remove the photoresist with the fourth thickness and etching the exposed part to form the TFT channel;

performing an ashing treatment to the substrate to remove the remaining photoresist in a region corresponding to the fifth thickness and form the source/drain electrode;

forming an insulating protection layer; and removing the remaining photoresist and the insulating protection layer above it to form the second leading wire hole using a lift-off process.

* * * * *